(12) United States Patent
Euler et al.

(10) Patent No.: US 7,276,915 B1
(45) Date of Patent: Oct. 2, 2007

(54) ELECTRICAL SERVICE MONITORING SYSTEM

(75) Inventors: Timothy D. Euler, Shawnee Mission, KS (US); Harold W. Johnson, Roach, MO (US)

(73) Assignee: Sprint Communications Company L.P., Overland Park, KS (US)

( * ) Notice: Subject to any disclaimer, the term of this patent is extended or adjusted under 35 U.S.C. 154(b) by 315 days.

(21) Appl. No.: 11/049,248

(22) Filed: Feb. 1, 2005

(51) Int. Cl.
*G01R 11/63* (2006.01)
*H04B 3/54* (2006.01)

(52) U.S. Cl. .............. 324/611; 324/103 R; 340/870.02

(58) Field of Classification Search ............... 324/611, 324/103 R; 713/300; 340/870.02, 870.27; 702/62; 700/291
See application file for complete search history.

(56) References Cited

U.S. PATENT DOCUMENTS

| | | | | |
|---|---|---|---|---|
| 4,701,698 A | * | 10/1987 | Karlsson et al. ............ | 324/116 |
| 5,384,712 A | * | 1/1995 | Oravetz et al. ............... | 702/62 |
| 5,684,710 A | * | 11/1997 | Ehlers et al. ............... | 700/293 |
| 7,054,770 B2 | * | 5/2006 | Swarztrauber et al. ........ | 702/62 |
| 2003/0050737 A1 | * | 3/2003 | Osann, Jr. ................... | 700/276 |
| 2004/0024717 A1 | * | 2/2004 | Sneeringer .................. | 705/412 |

OTHER PUBLICATIONS

"Power Monitors" Yokogawa; obtained Nov. 9, 2004; http://www.yokogawa.com/cis/PowerMonitoring Products/PowerMonitors/cis-prus-index0....

* cited by examiner

*Primary Examiner*—Anjan Deb

(57) ABSTRACT

A system and method that allows a consumer to monitor the electrical power usage in a residence is disclosed. The electrical use may be monitored at the service level, the circuit level, or at the group level. The electrical usage is communicated to a power monitoring system using a power line communications network (PLC). The monitored electrical usage can be accessed by both the utility supplying the electricity and by the consumer or owner of the residence.

18 Claims, 2 Drawing Sheets

US 7,276,915 B1

ELECTRICAL SERVICE MONITORING SYSTEM

RELATED APPLICATIONS

Not applicable

FEDERALLY SPONSORED RESEARCH OR DEVELOPMENT

Not applicable

MICROFICHE APPENDIX

Not applicable

BACKGROUND OF THE INVENTION

1. Field of the Invention

The invention is related to the field of electrical distribution systems, and in particular, to monitoring the electrical use of a residence using the electrical wires as part of the communications network.

2. Description of the Prior Art

Typically, the electrical power used by a residence is monitored with an external meter. The meter is checked once a month to determine the amount of electrical power used by the residence. Many meters are manually checked, although remotely read meters are gaining prevalence. In most cases the amount of power used by the residence is accumulated over the month and only the total amount of power used during the month is recorded. The rate of power usage during any given time is typically unavailable. Utilities typically charge more for electrical power at peak usage periods. The Utility may also have a tiered pricing structure where a low rate is charged for a base level of use, a higher rate is charged for next amount of power used, and the highest rate is charged for the amount of power used above a predetermined amount. For example, the first 1000 kilowatt/hours of electrical power may cost 5 cents per Kilowatt/hour, the next 500 kilowatt/hours may cost 8 cents per kilowatt/hour, and all power used in addition to the first 1500 kilowatt/hours may cost 15 cents per kilowatt/hour. A consumer that wishes to minimize their electrical costs currently has no way to monitor their electrical usage.

Systems are currently available that use the wiring in a residence as the connections or cabling for a communications network, for example the Ethernet to powerline homeplug adapter EC14H by Mirco-star international, ltd. These systems typically use the ground wire in the residence's power distribution system as the cabling for the communication network. By using the electrical wiring as the network connection, every plug or electrical outlet in the residence is automatically connected to the network. This allows a power monitoring system to monitor the power consumption in the residence at the outlet level, the group level, and the service level. In this application service level means the total electrical power entering the residence. Power monitors are well known in the arts and can be found that already have computer enabled connections. Agilent technologies and Yokogawa are two examples of manufactures that produce power monitors.

There is a need for a method and apparatus that allows a consumer to monitor the electrical power usage in a residence.

SUMMARY OF THE INVENTION

A system and method that allows a consumer to monitor the electrical power usage in a residence is disclosed. The electrical use may be monitored at the service level, the group level, or at the outlet level. The electrical usage is communicated to a power monitoring system using a power line communications network (PLC). The monitored electrical usage may be accessed by both the utility supplying the electricity and by the consumer or owner of the residence.

DETAILED DESCRIPTION OF THE PREFERRED EMBODIMENT

Figure 1:
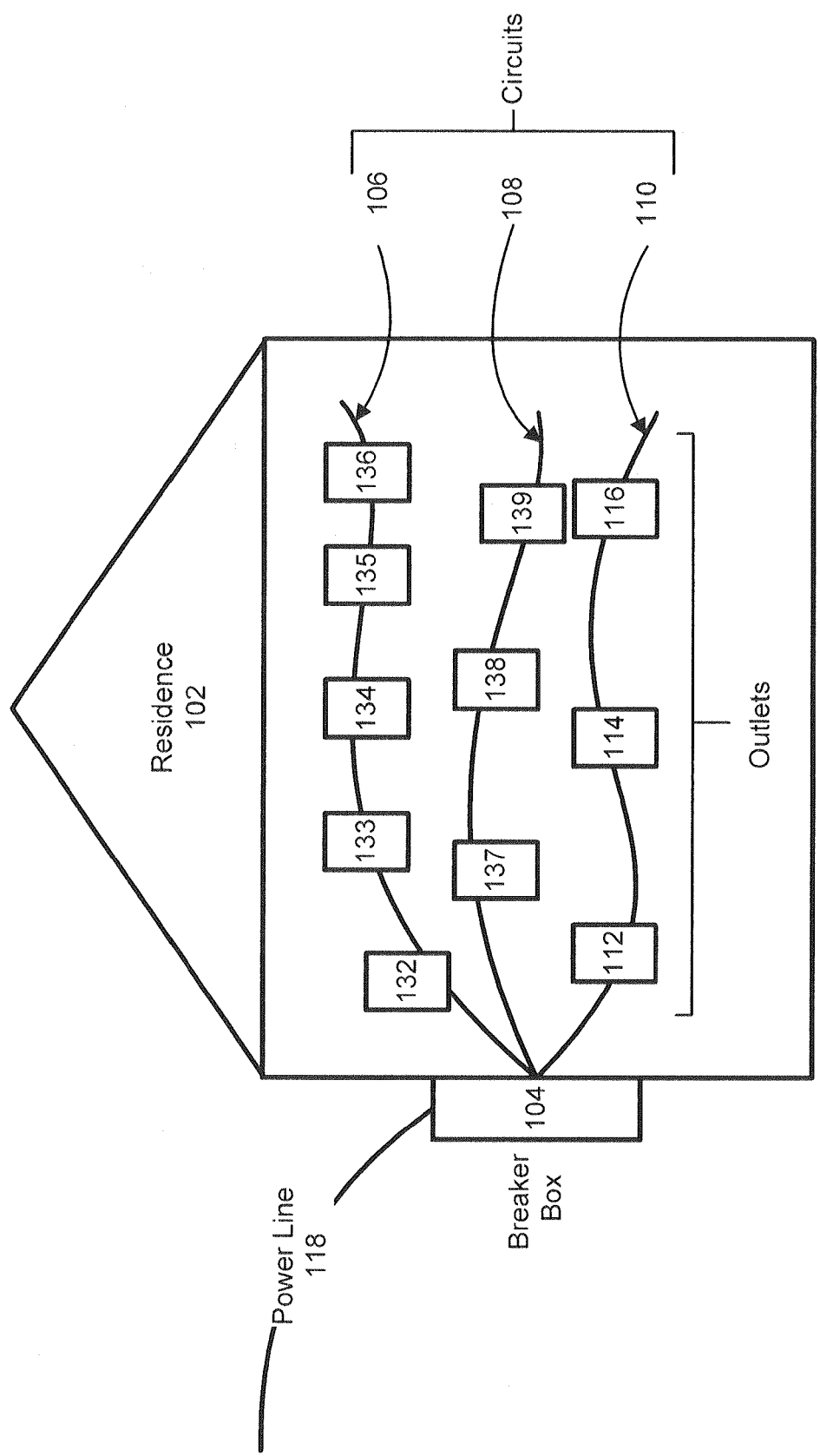
FIG. 1 is a schematic view of the electrical system in a residence in an example embodiment of the current invention.
Figure 2:
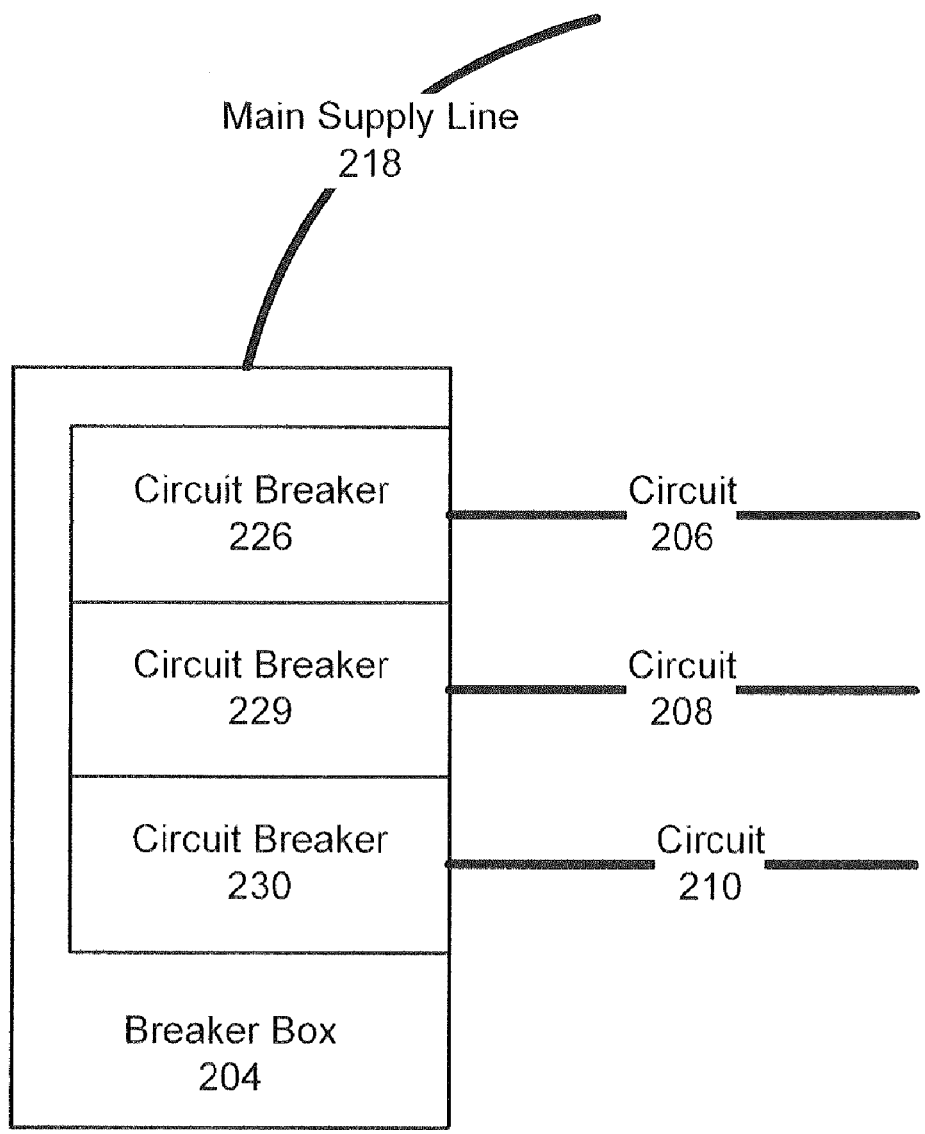
FIG. 2 is a schematic view of a breaker box in an example embodiment of the current invention.

FIGS. 1-2 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 1 is a schematic view of the electrical system in a residence in an example embodiment of the current invention. Residence 102 is fed by incoming power line 118. Power line 118 terminates into breaker box 104. A plurality of circuits are connected to breaker box 104. For clarity, only three circuits, 106, 108, and 110, are depicted. Each circuit has a plurality of plugs or outlets. Circuit 106 is shown with outlets 132-136. Circuit 108 is shown with outlets 137-139. Circuit 110 is shown with outlets 112, 114, and 116. Circuits that feed areas containing large appliances may only have one or two outlets, for example the circuit that feeds the furnace or the circuit that feeds the laundry room. FIG. 2 is a schematic view of a breaker box. Main supply line 218 enters the breaker box (204) and distributes power to each of the individual circuits. Each circuit typically has a circuit breaker associated with the circuit. Circuit 206 has corresponding circuit breaker 226, circuit 208 has corresponding circuit breaker 228, and circuit 210 has corresponding circuit breaker 230. Each circuit typically is made up of a bundle of three wires, a positive, a negative and a ground wire. Typically, each room in a residence has at least one circuit with at least one outlet or plug in the room.

In one example embodiment of the current invention, a power monitor would be used to monitor the rate of electrical use at each electrical outlet inside a residence. The power monitor would be connected to a power monitoring system using the electrical wiring of the residence. A network that uses the electrical wire inside a house as the network link is called a power line communication (PLC) network, for example a network that uses the Ethernet to powerline homeplug adapter EC14H by Mirco-star international, ltd would be considered a PLC network. The power monitoring system, using the home electrical wiring, monitors all the power meters at each of the electrical outlets. The power monitoring system may communicate the information from the monitored power to the utility and to the user. In one example embodiment the power monitoring system is connected to the internet, and the utility accesses the monitored power through the internet connection. In another example embodiment the power monitoring system is connected directly with the utility systems that allow the utility to monitor the power usage. The power monitoring system may be connected to the internet using any number of well known technologies, for example phone lines, wireless link to an ISP, cable system, or the like. The power monitoring system may be connected to the utility using any number of well known technologies, for example wireless link, cable system, broadband over powerlines (BPL), or the like The power monitoring system could be any computer system used to communicate with the plurality of power monitors distributed around the residence, for example a personal computer. In another example embodiment, the power monitoring system may be a microprocessor. There may be a microprocessor at each outlet or the microprocessor may be embedded into the breaker box, or may be located outside the residence, for example at the power distribution substation. In one example embodiment, the consumer may be allowed access to the monitored power usage through a web page. In another example embodiment of the invention, the user may be allowed direct access to the power monitoring system, for example when the power monitoring system is located at the residence. When the power monitoring system is located at the residence, the rate of power usage and the total accumulated power usage may be communicated to the utility using a number of different technologies, for example, using a phone line, using a wireless connection, using a broadband over powerline (BPL) connection, or the like. The information may be communicated to the utility periodically, for example once a month, or updated real time.

The power monitoring system, in communication with the power monitors, can measure the rate of electrical usage through out the residence. The power monitoring system can also accumulate the rate of use over time to generate the amount of electricity used at each power monitor during a given time period. The power monitoring system can be programmed to tie a number of individual power monitors into groups. In this way the power consumption can be measured at a circuit level, or at a particular set of outlets that correspond to a user defined group. For example, if the user was running a small business in the residence and wanted to determine the power usage for the small business, the user could group all the power monitors from outlets used by the small business, into one group. This would allow the user to measure the electrical usage of the devices used by the small business. Other user defined groups are envisioned, for example all the outlets used by the laundry appliances, all the outlets used by the kitchen appliances, and the like. The groups may be defined using direct access to the power monitoring system, or may be defined using a web page, or the like.

In another embodiment of the current invention, the power monitors would only be placed on each circuit in the residence. In this example the power monitors may all be located at or inside the breaker box. By using a power monitor for each circuit instead of one for every outlet, the cost of the system can be reduced.

We claim:

1. A method comprising:
    monitoring an electrical power usage of a plurality of electrical outlets at a residence using a power line communications (PLC) network;
    determining a first electrical power usage of a first group of outlets of the plurality of electrical outlets;
    determining a second electrical power usage of a second group of outlets of the plurality of electrical outlets; and
    providing the monitored power usage including the first electrical power usage and the second electrical power usage on a web site where the web site is accessible to both an electrical utility and a customer of the electrical utility.

2. The method of claim 1 wherein the first group of outlets is associated with a residence and the second group of outlets is associated with a business.

3. A method, comprising:
    monitoring a rate of electrical usage of a plurality of electrical outlets in a residence;
    communicating a first rate of electrical usage from a first group of outlets of the plurality of electrical outlets to a power monitor system using a power line communications network; and
    communicating a second rate of electrical usage from a second group of outlets of the plurality of electrical outlets to the power monitor system using the power line communications network.

4. The method of claim 3 wherein the monitored rate of electrical usage including the first rate of electrical usage and the second rate of electrical usage is accessible to both a utility supplying the electrical power and a customer of the utility.

5. The method of claim 3, further comprising:
    summing the rate of electrical usage from the plurality of electrical outlets to generate a total rate of electrical usage for the residence;
    summing the rate of electrical usage from the first group of outlets to generate the first rate of electrical usage in the residence; and
    summing the rate of electrical usage from the second group of outlets to generate the second rate of electrical usage in the residence.

6. The method of claim 5, further comprising:
    displaying the total rate of electrical usage from the plurality of electrical outlets of the residence;
    displaying the first rate of electrical usage from the first group of outlets in the residence; and
    displaying the second rate of electrical usage from the second group of outlets in the residence.

7. The method of claim 5 wherein the first group of outlets is associated with a residence.

8. The method of claim 5 wherein the second group of outlets is associated with a business.

9. The method of claim 5, further comprising:
    accumulating the total rate of electrical usage from the plurality of electrical outlets of the residence over a time period;
    accumulating the first rate of electrical usage from the first group of outlets in the residence over the time period;
    accumulating the second rate of electrical usage from the second group of outlets in the residence over the time period;
    displaying the accumulated total electrical usage from the plurality of electrical outlets for the residence for the time period;

displaying the accumulated first rate of electrical usage from the first group of outlets in the residence; and displaying the accumulated second rate of electrical usage from the second group of outlets in the residence.

10. The method of claim 9 wherein the time period is one month.

11. A method, comprising:

monitoring a rate of electrical usage of a plurality of electrical circuits in a residence;

communicating a first rate of electrical usage from a first group of circuits of the plurality of electrical circuits to a power monitor system using a power line communications network; and communicating a second rate of electrical usage from a second group of circuits of the plurality of electrical circuits to a power monitor system using a power line communications network.

12. The method of claim 11 wherein the monitored rate of electrical usage including the first rate of electrical usage and the second rate of electrical usage is accessible to both a utility supplying the electrical power and a consumer of the utility.

13. A power monitoring system, comprising:

a plurality of power monitors;

a power line communications network running on an electrical wiring of a residence where the power line communications network connects the plurality of power monitors;

a computer system configured to communicate with the plurality of power monitors using the power line communications network such that an electrical use of a plurality of electrical outlets including a first group of outlets and a second group of outlets in the residence is monitored.

14. The power monitoring system of claim 13 where the plurality of power monitors are distributed at each electrical outlet in the residence.

15. The power monitoring system of claim 13 where the plurality of power monitors are distributed on each electrical circuit in a breaker box feeding the residence.

16. The power monitoring system of claim 13 where the computer system is in the residence.

17. The power monitoring system of claim 16 where the computer system communicates with the utility using one of the following: broadband over powerline, phone line, wireless link.

18. The power monitoring system of claim 16 where the monitored electrical use is available on a web page.

* * * * *